(12) United States Patent
Cobbley (10) Patent No.: US 7,332,376 B2
(45) Date of Patent: Feb. 19, 2008

(54) METHOD OF ENCAPSULATING PACKAGED MICROELECTRONIC DEVICES WITH A BARRIER

(75) Inventor: Chad A. Cobbley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/516,455

(22) Filed: Sep. 5, 2006

(65) Prior Publication Data

US 2007/0063335 A1 Mar. 22, 2007

Related U.S. Application Data

(60) Continuation of application No. 10/970,399, filed on Oct. 20, 2004, now Pat. No. 7,101,737, which is a division of application No. 09/649,428, filed on Aug. 28, 2000, now Pat. No. 6,838,760.

(51) Int. Cl.
  *H01L 21/48* (2006.01)
  *H01L 23/48* (2006.01)
  *H05K 3/30* (2006.01)

(52) U.S. Cl. .................. 438/125; 438/127; 29/841; 29/855; 257/787

(58) Field of Classification Search .............. None
See application file for complete search history.

(56) References Cited

U.S. PATENT DOCUMENTS 3,672,046 A  6/1972  Storey, II et al.

(Continued)

FOREIGN PATENT DOCUMENTS

| JP | 60208847 | 10/1985 |
| JP | 62032622 | 2/1987 |
| JP | 62229949 | 10/1987 |
| JP | 01244629 | 9/1989 |
| JP | 05299536 | 11/1993 |

(Continued)

OTHER PUBLICATIONS

Peter Van Zant, Microchip Fabrication, Fourth Edition, McGraw-Hill, New York, Chapter 18, Packaging, pp. 557-593.

*Primary Examiner*—Alonzo Chambliss
(74) *Attorney, Agent, or Firm*—Perkins Coie LLP (57) ABSTRACT

Methods and apparatuses for encapsulating a microelectronic die or other components in the fabrication of packaged microelectronic devices. In one aspect of the invention, a packaged microelectronic device assembly includes a microelectronic die, a substrate attached to the die, a protective casing covering a portion of the substrate, and a barrier projecting away from the surface of the substrate. The microelectronic die can have an integrated circuit and a plurality of bond-pads operatively coupled to the integrated circuit. The substrate can have a cap-zone defined by an area that is to be covered by the protective casing, a plurality of contact elements arranged in the cap-zone, a plurality of ball-pads arranged in a ball-pad array outside of the cap-zone, and a plurality of conductive lines coupling the contact elements to the ball-pads. The contact elements are electrically coupled to corresponding bond-pads on the microelectronic die, and the protective casing covers the cap-zone. The barrier on the surface of the substrate is configured so that at least a portion of the barrier is outside of the cap-zone and adjacent to at least a portion of the molded section. The barrier is a seal that inhibits the thermosetting material of the protective casing from covering a portion of the substrate outside of the cap-zone. As such, the barrier prevents thermosetting material from leaking between the substrate and a mold outside of the cap-zone during a molding process.

22 Claims, 5 Drawing Sheets

U.S. PATENT DOCUMENTS

| | | |
|---|---|---|
| 4,012,307 A | 3/1977 | Phillips |
| 4,285,780 A | 8/1981 | Schachter |
| 4,769,344 A | 9/1988 | Sakai et al. |
| 4,777,520 A | 10/1988 | Nambu et al. |
| 4,855,807 A | 8/1989 | Yamaji et al. |
| 4,866,506 A | 9/1989 | Nambu et al. |
| 4,882,212 A | 11/1989 | SinghDeo et al. |
| 4,887,149 A | 12/1989 | Ramano' |
| 5,107,328 A | 4/1992 | Kinsman |
| 5,128,831 A | 7/1992 | Fox, III et al. |
| 5,138,434 A | 8/1992 | Wood et al. |
| 5,147,821 A | 9/1992 | McShane et al. |
| 5,191,174 A | 3/1993 | Chang et al. |
| 5,195,023 A | 3/1993 | Manzione et al. |
| 5,197,183 A | 3/1993 | Chia et al. |
| 5,208,467 A | 5/1993 | Yamazaki |
| 5,296,738 A | 3/1994 | Freyman et al. |
| 5,309,026 A | 5/1994 | Matsumoto |
| 5,314,842 A | 5/1994 | Sawaya et al. |
| 5,363,280 A | 11/1994 | Chobot et al. |
| 5,365,655 A | 11/1994 | Rose |
| 5,449,427 A | 9/1995 | Wojnarowski et al. |
| 5,474,958 A | 12/1995 | Djennas et al. |
| 5,527,743 A | 6/1996 | Variot |
| 5,578,261 A | 11/1996 | Manzione et al. |
| 5,593,927 A | 1/1997 | Farnworth et al. |
| 5,596,231 A | 1/1997 | Combs |
| 5,606,204 A | 2/1997 | Tsuji |
| 5,609,889 A | 3/1997 | Weber |
| 5,612,576 A | 3/1997 | Wilson et al. |
| H1654 H * | 6/1997 | Rounds ...................... 264/511 |
| 5,635,220 A | 6/1997 | Izumi et al. |
| 5,665,281 A | 9/1997 | Drummond |
| 5,665,296 A | 9/1997 | Jain et al. |
| 5,677,566 A | 10/1997 | King et al. |
| 5,696,033 A | 12/1997 | Kinsman |
| 5,710,071 A | 1/1998 | Beddingfield et al. |
| 5,721,450 A | 2/1998 | Miles |
| 5,728,600 A | 3/1998 | Saxelby, Jr. et al. |
| 5,739,585 A | 4/1998 | Akram et al. |
| 5,750,423 A | 5/1998 | Ishii |
| D394,844 S | 6/1998 | Farnworth et al. |
| 5,766,649 A | 6/1998 | Azuma |
| 5,767,446 A | 6/1998 | Ha et al. |
| 5,773,322 A | 6/1998 | Weld |
| 5,793,613 A | 8/1998 | Poinelli et al. |
| 5,796,159 A | 8/1998 | Kierse |
| 5,815,000 A | 9/1998 | Farnworth et al. |
| D402,638 S | 12/1998 | Farnworth et al. |
| 5,842,275 A | 12/1998 | McMillan, II et al. |
| 5,851,845 A | 12/1998 | Wood et al. |
| 5,866,953 A | 2/1999 | Akram et al. |
| 5,891,384 A * | 4/1999 | Miyajima ................... 264/511 |
| 5,891,753 A | 4/1999 | Akram |
| 5,893,726 A | 4/1999 | Farnworth et al. |
| 5,898,224 A | 4/1999 | Akram |
| 5,917,234 A | 6/1999 | Tsuruzono |
| 5,920,768 A | 7/1999 | Shintai |
| 5,928,595 A | 7/1999 | Knapp et al. |
| 5,933,713 A | 8/1999 | Farnworth |
| 5,938,956 A | 8/1999 | Hembree et al. |
| 5,945,130 A | 8/1999 | Saxelby, Jr. et al. |
| 5,946,553 A | 8/1999 | Wood et al. |
| 5,958,100 A | 9/1999 | Farnworth et al. |
| 5,964,030 A | 10/1999 | Lee et al. |
| 5,986,209 A | 11/1999 | Tandy |
| 5,989,941 A | 11/1999 | Wensel |
| 5,990,566 A | 11/1999 | Farnworth et al. |
| 5,994,784 A | 11/1999 | Ahmad |
| RE36,469 E | 12/1999 | Wood et al. |
| 5,998,243 A | 12/1999 | Odashima et al. |
| 6,000,924 A | 12/1999 | Wang et al. |
| 6,008,070 A | 12/1999 | Farnworth |
| 6,013,946 A | 1/2000 | Lee et al. |
| 6,020,629 A | 2/2000 | Farnworth et al. |
| 6,025,728 A | 2/2000 | Hembree et al. |
| 6,028,365 A | 2/2000 | Akram et al. |
| 6,046,496 A | 4/2000 | Corisis et al. |
| 6,048,744 A | 4/2000 | Corisis et al. |
| 6,048,755 A | 4/2000 | Jiang et al. |
| 6,049,125 A | 4/2000 | Brooks et al. |
| 6,054,755 A | 4/2000 | Takamichi et al. |
| 6,066,514 A | 5/2000 | King et al. |
| 6,071,758 A | 6/2000 | Steffen |
| 6,072,236 A | 6/2000 | Akram et al. |
| 6,075,288 A | 6/2000 | Akram |
| 6,089,920 A | 7/2000 | Farnworth et al. |
| 6,094,058 A | 7/2000 | Hembree et al. |
| 6,097,087 A | 8/2000 | Farnworth et al. |
| 6,100,598 A | 8/2000 | Kanesaka |
| 6,103,547 A | 8/2000 | Corisis et al. |
| 6,107,122 A | 8/2000 | Wood et al. |
| 6,107,680 A | 8/2000 | Hodges |
| 6,114,189 A | 9/2000 | Chia et al. |
| 6,117,382 A | 9/2000 | Thummel |
| 6,124,634 A | 9/2000 | Akram et al. |
| 6,126,428 A | 10/2000 | Mitchell et al. |
| 6,143,581 A | 11/2000 | Johnson et al. |
| 6,150,717 A | 11/2000 | Wood et al. |
| 6,159,764 A | 12/2000 | Kinsman et al. |
| 6,168,970 B1 | 1/2001 | Burns |
| 6,172,419 B1 | 1/2001 | Kinsman |
| 6,175,159 B1 | 1/2001 | Sasaki |
| 6,184,465 B1 | 2/2001 | Corisis |
| 6,191,472 B1 | 2/2001 | Mazumder |
| 6,198,172 B1 | 3/2001 | King et al. |
| 6,208,519 B1 | 3/2001 | Jiang et al. |
| 6,210,992 B1 | 4/2001 | Tandy et al. |
| 6,215,175 B1 | 4/2001 | Kinsman |
| 6,228,548 B1 | 5/2001 | King et al. |
| 6,228,687 B1 | 5/2001 | Akram et al. |
| 6,229,202 B1 | 5/2001 | Corisis |
| 6,235,994 B1 | 5/2001 | Chamberlin et al. |
| 6,242,802 B1 | 6/2001 | Miles et al. |
| 6,246,108 B1 | 6/2001 | Corisis et al. |
| 6,252,298 B1 | 6/2001 | Lee et al. |
| 6,258,623 B1 | 7/2001 | Moden et al. |
| 6,258,624 B1 | 7/2001 | Corisis |
| 6,259,153 B1 | 7/2001 | Corisis |
| 6,262,480 B1 | 7/2001 | Ferri et al. |
| 6,277,671 B1 | 8/2001 | Tripard |
| 6,284,571 B1 | 9/2001 | Corisis et al. |
| 6,291,894 B1 | 9/2001 | Farnworth et al. |
| 6,291,895 B1 | 9/2001 | Taniguchi et al. |
| 6,294,839 B1 | 9/2001 | Mess et al. |
| 6,300,165 B2 | 10/2001 | Castro |
| 6,303,981 B1 | 10/2001 | Moden |
| 6,303,985 B1 | 10/2001 | Larson et al. |
| 6,309,916 B1 | 10/2001 | Crowley et al. |
| 6,310,390 B1 | 10/2001 | Moden |
| 6,314,639 B1 | 11/2001 | Corisis |
| 6,316,285 B1 | 11/2001 | Jiang et al. |
| 6,326,242 B1 | 12/2001 | Brooks et al. |
| 6,326,244 B1 | 12/2001 | Brooks et al. |
| 6,326,687 B1 | 12/2001 | Corisis |
| 6,326,697 B1 | 12/2001 | Farnworth |
| 6,326,698 B1 | 12/2001 | Akram |
| 6,329,220 B1 | 12/2001 | Bolken et al. |
| 6,329,603 B1 | 12/2001 | Japp et al. |
| 6,331,221 B1 | 12/2001 | Cobbley |
| 6,331,453 B1 | 12/2001 | Bolken et al. |
| 6,332,766 B1 | 12/2001 | Thummel |
| 6,338,813 B1 | 1/2002 | Hsu et al. |
| 6,403,009 B1 | 6/2002 | Saxelby, Jr. et al. |

| | | |
|---|---|---|
| 6,413,801 B1 | 7/2002 | Lin |
| 6,472,252 B2 | 10/2002 | Mess |
| 6,483,044 B1 | 11/2002 | Ahmad |
| 6,534,861 B1 * | 3/2003 | Castro ................ 257/734 |
| 6,589,820 B1 | 7/2003 | Bolken |
| 6,653,173 B2 | 11/2003 | Bolken |
| 6,664,139 B2 | 12/2003 | Bolken |
| 6,677,675 B2 | 1/2004 | Bolken |
| 6,683,388 B2 | 1/2004 | Bolken |
| 6,796,028 B2 | 9/2004 | Ahmad |
| 6,838,760 B1 | 1/2005 | Cobbley |
| 6,979,595 B1 | 12/2005 | James et al. |
| 7,049,685 B2 * | 5/2006 | James et al. ............ 257/669 |
| 7,101,737 B2 | 9/2006 | Cobbley |
| 2001/0038144 A1 * | 11/2001 | Grigg ................ 257/698 |
| 2002/0050654 A1 | 5/2002 | Bolken |
| 2002/0052063 A1 | 5/2002 | Bolken |
| 2002/0175399 A1 | 11/2002 | James et al. |
| 2003/0106709 A1 | 6/2003 | Ahmad |
| 2003/0109083 A1 | 6/2003 | Ahmad |

FOREIGN PATENT DOCUMENTS

| | | |
|---|---|---|
| JP | 10065043 | 3/1998 |
| JP | 11017048 | 1/1999 |
| JP | 11026489 | 1/1999 |
| JP | 11077733 | 3/1999 |
| JP | 2000106375 | 4/2000 |
| JP | 2001076689 | 3/2001 |
| JP | 2001085565 | 3/2001 |
| KR | 2001038773 | 5/2001 |

* cited by examiner

METHOD OF ENCAPSULATING PACKAGED MICROELECTRONIC DEVICES WITH A BARRIER

CROSS-REFERENCE TO RELATED APPLICATIONS

This application is a continuation of U.S. patent application Ser. No. 10/970,399 filed Oct. 20, 2004, now U.S. Pat. No. 7,101,737 issued Sep. 5, 2006, which is a divisional of U.S. patent application Ser. No. 09/649,428 filed Aug. 28, 2000, now U.S. Pat. No. 6,838,760 issued Jan. 4, 2005, both of which are incorporated herein by reference in their entireties.

TECHNICAL FIELD

The present invention relates to packaging microelectronic devices having a microelectronic die including an integrated circuit. More particularly, several aspects of the invention are related to an interconnecting unit for operatively coupling the microelectronic die to voltage sources, signal sources, and other input/output sources.

BACKGROUND

Microelectronic devices, such as memory devices and microprocessors, typically include a microelectronic die encased in a protective covering. The die can include memory cells, processor circuits, interconnecting circuitry and/or other functional features. The die also typically includes an array of very small bond-pads electrically coupled to the functional features. When the die is packaged, the bond-pads are coupled to leads, solder ball-pads or other types of terminals for operatively coupling the microelectronic dies to buses, circuits and/or other microelectronic devices.

Several different techniques have been developed for packaging microelectronic dies. The dies, for example, can be incorporated into individual packages, mounted with other components in hybrid or multiple chip modules, or connected directly to a printed circuit board or other types of substrates. When a die is incorporated into an individual package, the bond-pads on the die are typically coupled to a lead frame, and the die is covered or otherwise sealed from the environment. When the die is attached directly to a printed circuit board or another type of substrate, the bond-pads on the die are typically coupled to corresponding contact elements on the substrate using wire-bond lines, ball grid arrays and other techniques. The dies that are mounted directly to the substrates are generally Chip Scale Package devices (CSP) or Flip Chip Bare Die devices (Flip-Chip).

CSP and Flip-Chip devices generally have one or more protective casings that encapsulate the dies and any exposed contact elements, bond-pads or wire-bond lines. The protective casings should shield the die and the other components on the substrate from environmental factors (e.g., moisture), electrical interference, and mechanical shocks. The protective casings are accordingly robust elements that protect the sensitive components of a microelectronic device. The protective casings are generally composed of plastics, ceramics, or thermosetting materials.

One conventional technique for fabricating the protective casings involves placing the die in a cavity of a mold, and then injecting a thermosetting material into the cavity. The thermosetting material flows over the die on one side of the substrate until it fills the cavity, and then the thermosetting material is cured so that it hardens into a suitable protective casing for protecting the die. The protective casing should not have any voids over the die because contaminants from the molding process or environmental factors outside of the mold could damage the die. The thermosetting material, moreover, should not cover a ball-pad array on the substrate or damage any electrical connections between the die and the substrate. Therefore, the thermosetting material should be molded in a manner that avoids (a) producing voids in the protective casing, (b) covering certain portions of the substrate, and (c) displacing or otherwise damaging any wire-bond lines or solder joints between the die and the substrate.

One drawback of forming protective casings is that the thermosetting material may leak between the substrate and a mold assembly as the thermosetting material fills the mold. The thermosetting material generally leaks because the substrates can have small surface asperities and/or be warped. Such leaking of the thermosetting material can cover ball-pad arrays and/or adhere to the mold. When the thermosetting material covers a portion of the ball-pad array, the packaged device is typically rejected because it cannot be electrically coupled to a module. Additionally, the molds must be cleaned periodically to remove the thermosetting material that adheres to the mold. Cleaning the molds, however, is difficult because they operate at approximately 180° C., and thus they are difficult to handle and they must also be reheated after they have been cleaned. The down time for cleaning a mold can be approximately 15% of the available operating time for a molding machine. Therefore, it would be desirable to prevent the thermosetting material from leaking between the substrate and the mold.

One technique that addresses the leakage between the substrate and the mold is to cover the inside of the mold with a thin plastic film. This technique, however, is time consuming because the mold must generally be cooled to a temperature at which it can be handled, and it is difficult to attach the plastic film to the mold without creating wrinkles in the plastic film. Moreover, if the plastic film has wrinkles, the resulting protective casings may have surface asperities that are either unsightly or impair the performance of the protective casing. Therefore, covering the inside of a mold with a thin plastic film is not a good solution for preventing the thermosetting material from leaking between the substrate and the mold.

SUMMARY

The present invention is directed toward methods and apparatuses for encapsulating a microelectronic die or other components in the fabrication of packaged microelectronic devices. In one aspect of the invention, a packaged microelectronic device assembly includes a microelectronic die, a substrate attached to the die, a protective casing covering a portion of the substrate, and a barrier projecting away from the surface of the substrate. The microelectronic die can have an integrated circuit and a plurality of bond-pads operatively coupled to the integrated circuit. The substrate can have a cap-zone defined by the area covered by the protective casing, a plurality of contact elements arranged in the cap-zone, a plurality of ball-pads arranged in a ball-pad array outside of the cap-zone, and a plurality of conductive lines coupling the contact elements to corresponding ball-pads. The barrier is configured so that at least a portion of the barrier is outside of the cap-zone and adjacent to at least a portion of the molded section. The barrier, for example, can be a thin tape applied to the substrate, a polymeric coating covering the substrate, another type of thin film disposed on the substrate, or a ridge formed from the substrate itself. The barrier can have an opening with an edge that borders the cap-zone so that the area of the cap-zone is not covered by the barrier. In operation, the barrier inhibits the thermosetting material from covering a portion of the substrate outside of the cap-zone. As such, the barrier prevents or at least inhibits the thermosetting material from leaking between the substrate and a mold outside of the cap-zone during a molding process.

DETAILED DESCRIPTION

The following disclosure is directed toward packaged microelectronic devices, interconnecting units for packaged microelectronic devices, and methods for encapsulating a microelectronic die, wire-bond lines or other components of a microelectronic device. Several embodiments of the invention are described with respect to memory devices, but the methods and apparatuses are also applicable to microprocessors and other types of devices. One skilled in the art will accordingly understand that the present invention may have additional embodiments, or that the invention may be practiced without several of the details described below.

Figure 1A:
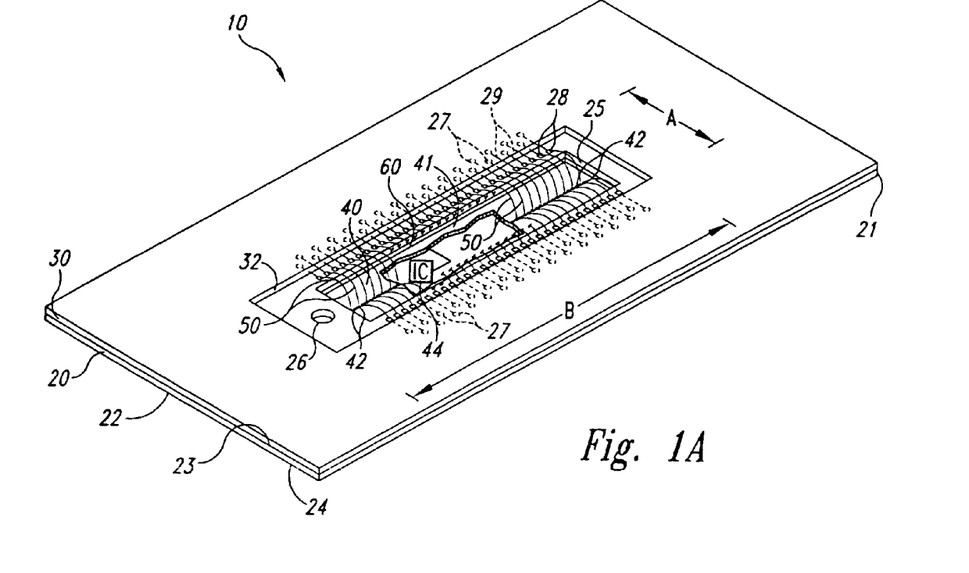
FIG. 1A is top cut-away isometric view of a microelectronic device before being packaged in accordance with one embodiment of the invention.
Figure 1B:
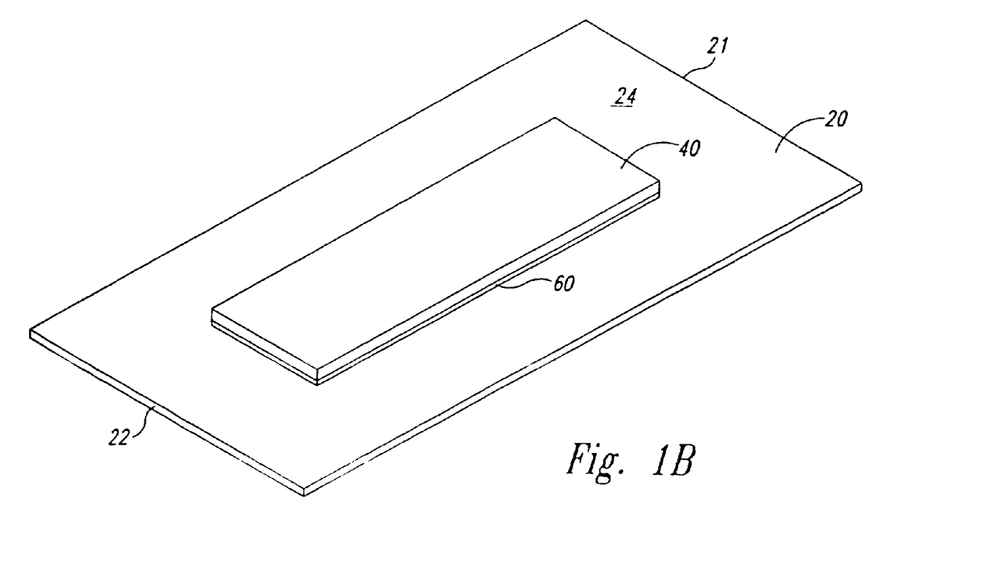
FIG. 1B is a bottom isometric view of the microelectronic device of FIG. 1A.

FIG. 1A is a top cutaway isometric view of a microelectronic device 10 in accordance with one embodiment of the invention before it has been encapsulated. The microelectronic device 10 can include a substrate 20 and a microelectronic die 40 attached to the substrate 20 by an adhesive 60. The microelectronic device 10 shown in FIG. 1 illustrates the substrate 20 and the die 40 before forming protective casings that encapsulate the die 40 and portions of the substrate 20. The following description is directed toward encapsulating a microelectronic die on a flexible substrate, but it is expected that several embodiments of methods and apparatuses in accordance with the present invention may be used to encapsulate a large variety of electrical and/or non-electrical articles. Therefore, the following description with respect to encapsulating the microelectronic die 20 shown in FIGS. 1A-6 is for the purpose of illustration only and it is not intended to limit the scope of the invention.

The embodiment of the substrate 20 shown in FIG. 1A can have a first end 21, a second end 22 opposite the first end 21, a first surface 23, and a second surface 24 opposite the first surface 23. The substrate 20 can also include an elongated slot 25 between the first and second surfaces 23 and 24 that extends lengthwise along a medial portion of the substrate 20. Additionally, an aperture 26 through the substrate 20 can be located at a secondary gate location that is generally proximate to the second end 22 of the substrate 20. The substrate 20 is one component of an interconnecting unit that provides a plurality of interconnects, such as an array of ball-pads, for coupling very small bond-pads on the microelectronic die 40 to voltage sources, signal sources, and/or other input and output sources. The interconnects can be electrical components or optical components that transmit a signal. In the embodiment shown in FIG. 1A, the substrate 20 includes a plurality of interconnects defined by an array of ball-pads 27, an array of contact elements 28 proximate to the slot 25, and a trace 29 or other type of conductive line between each ball-pad 27 and a corresponding contact element 28. The substrate 20 can be a flexible material or a substantially rigid material, and the traces 29 can be conductive lines that are printed on the substrate in a manner similar to printed circuit boards.

The embodiment of the microelectronic die 40 shown in FIG. 1A includes a first side 41 attached to the second surface 24 of the substrate 20 by the adhesive 60. The microelectronic die 40 can also include a plurality of small bond-pads 42 and an integrated circuit 44 (shown schematically) coupled to the bond-pads 42. The bond-pads 42 are arranged in an array along the first side 41 of the microelectronic die 40 so that the bond-pads 42 are aligned with or otherwise accessible through the slot 25 in the substrate 20. A plurality of wire-bond lines 50 or other types of connectors couple the bond-pads 42 on the die 40 to corresponding contact elements 28 on the substrate 20. As such, the substrate 20 distributes the very small bond-pads 42 to the larger array of ball-pads 27. Referring to FIG. 1B, the die 40 can project away from the second surface 24 of the substrate 20.

Referring again to FIG. 1A, the contact elements 28, the bond-pads 42, and the connectors 50 are arranged in a cap-zone defined by an area that is to be encapsulated by a protective casing. In the embodiment shown in FIG. 1A, the microelectronic device 10 has a first cap-zone over the first surface 23 of the substrate 20 shown by an area A×B. The cap-zone can have a different configuration for a different type of microelectronic device. In other embodiments, for example, the cap-zone can be around the die 40 over the second surface 24 of the substrate.

The microelectronic device 10 shown in FIG. 1A can also include a barrier 30 disposed on the substrate 20. The barrier 30 is another component of the inter-connecting unit along with the substrate 20. In this embodiment, the barrier 30 has an opening 32 surrounding the cap-zone A×B on the substrate 20. The opening 32 in the barrier 30 can be adjacent to the border of the cap-zone A×B to completely surround the cap-zone A×B. The barrier 30 can accordingly cover the ball-pads 27 on the substrate, but the contact elements 28, the bond-pads 42, and the wire-bond lines 50 are exposed through the opening 32 of the barrier 30. In other applications, only a portion of the barrier 30 is adjacent to only a portion of the cap-zone. The barrier 30, for example, could be adjacent to the elongated sides of the cap-zone along the contact elements 28 and the end of the cap-zone at the aperture 26, but the barrier 30 may not cover the area at the first end 21 of the first surface 23 of the substrate 20. The barrier 30 is accordingly disposed on the substrate 20 outside of the cap-zone A×B so that at least a portion of the barrier 30 is adjacent to at least a portion of the cap-zone A×B. As explained in more detail below, the barrier 30 acts as a gasket that inhibits or prevents a thermosetting material from leaking outside of the cap-zone between the substrate 20 and a mold assembly.

The barrier 30 is applied to or otherwise formed on the substrate 20 before molding a protective casing over the cap-zone. In the embodiment shown in FIG. 1A, the barrier 30 is a thin film, such as a tape, that is adhered to the substrate 20, or a pliable polymeric coating that is deposited onto the substrate 20. The barrier 30 can alternatively be made from other materials. In one embodiment, the barrier 30 is a roll of tape having a plurality of apertures that is applied to a continuous strip of substrate material having a plurality of slots so that each opening of the tape surrounds a corresponding slot. The strip can be cut to form a separate interconnecting unit having one or more individual pairs of the substrate 20 and the barrier 30. In another embodiment, the barrier 30 is an individual piece of tape applied to an individual substrate 20. In still another embodiment, the barrier 30 is a coating of a polymeric material, rubber, or other compressible and/or pliable material that is deposited onto the substrate 20. Such coatings can be deposited by screen printing techniques, or by spraying a layer of material on the substrate.

Figure 2A:
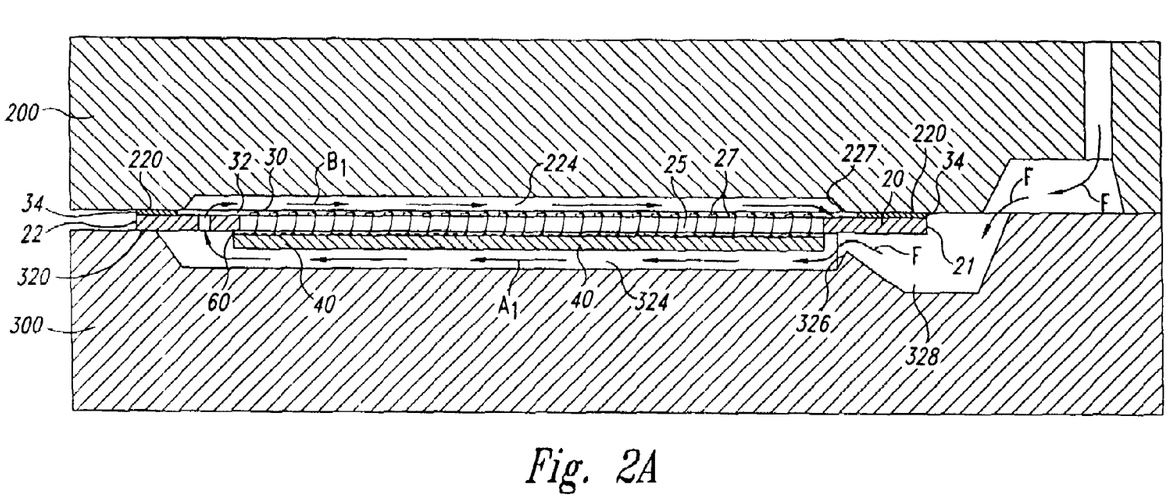
FIG. 2A is a side cross-sectional view of the microelectronic device of FIG. 1A being packaged in accordance with an embodiment of the invention.
Figure 2B:
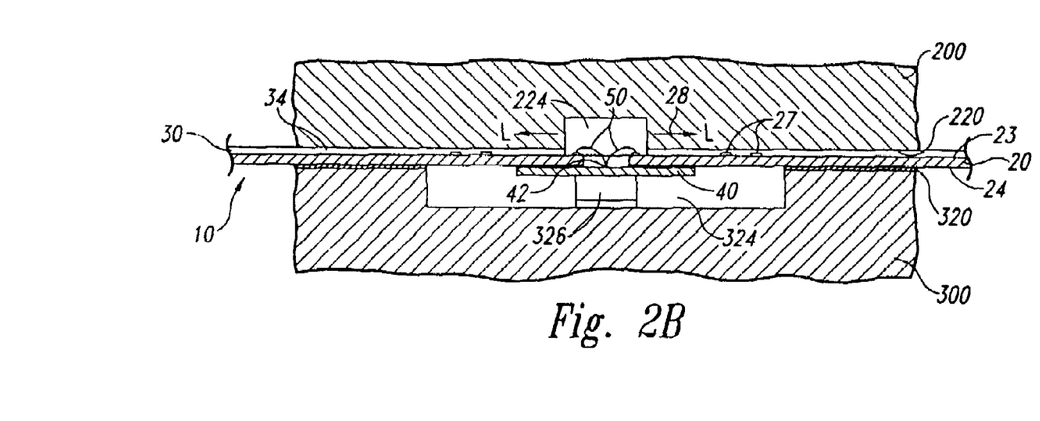
FIG. 2B is a front cross-sectional view of the microelectronic device of FIG. 2A being packaged in accordance with an embodiment of the invention.

FIGS. 2A and 2B illustrate an embodiment of a method for encapsulating the microelectronic device 10 using a mold assembly having a first mold section 200 and a second mold section 300. The first mold section 200 has a bearing surface 220 and a wire-side cavity 224, and the second mold section 300 has a bearing surface 320 and a die-side cavity 324. The wire-side cavity 224 is configured to form a first protective casing over the cap-zone A×B shown in FIG. 1A, and the die-side cavity 324 is configured to form a second protective casing over the die 40 shown in FIG. 1B. The second mold section 300 can also include a gate 326 and an injection chamber 328 through which a flow "F" of mold compound (e.g., thermosetting material) is injected into the die-side cavity 324.

During the molding process, the microelectronic device 10 is positioned in the mold assembly to align the die 40 with the die-side cavity 324 and to align the cap-zone A×B with the wire-side cavity 224 (best shown in FIG. 2B). In this embodiment, the bearing surface 220 of the first mold section 200 presses against a perimeter portion 34 of the barrier 30, and the bearing surface 320 of the second mold section 300 presses against the second surface 24 of the substrate 20. The bearing surface 220 of the first mold section 200 can press against the perimeter portion 34 of the barrier 30 by injecting a mold compound into the die-side cavity 324, as explained in U.S. patent application Ser. No. 09/255,554, which is herein incorporated by reference. The flow of mold compound F initially passes through the gate 326 of the second mold section 300. The flow of mold compound F continues into the die-side cavity 324 to create a first flow $A_1$ heading in a first direction toward the second end 22 of the substrate 20. The first flow of mold compound $A_1$ passes through the aperture 26 in the substrate 20 to generate a second flow of mold compound $B_1$ that flows through the wire-side cavity 224 of the first mold section 200. The second flow of mold compound $B_1$ fills the slot 25 of the substrate 20 and flows in a second direction until it reaches a terminal end 227 of the wire-side cavity 224.

The barrier 30 on the substrate 20 is expected to inhibit or prevent the mold compound from leaking between the first side 23 of the substrate 20 and the bearing surface 220 of the first mold section 200. For example, as the pressure of the mold compound builds in the die-side cavity 324, the pressurized mold compound drives the substrate 20 toward the first mold section 200 to press the perimeter portion 34 of the barrier 30 against the bearing surface 220. The perimeter portion 34 of the barrier 30 accordingly fills small voids or surface asperities on both the first surface 23 of the substrate 20 and the bearing surface 220 of the first mold section 200. As such, the perimeter portion 34 of the barrier 30 inhibits the mold compound from leaking at the second end 22 of the substrate 20. Moreover, as shown by FIG. 2B, the barrier 30 also inhibits or prevents the mold compound from leaking between the substrate 20 and the bearing surface 220 of the first mold section 200 in a lateral direction L relative to the second flow of mold compound $B_1$ (FIG. 2A). The barrier 30 accordingly prevents the mold compound from inadvertently covering the ball-pads 27 on the first surface 23 of the substrate 20 or fouling the mold assembly at the second end 22 of the substrate 20.

One expected advantage of the embodiment of the barrier 30 shown in FIGS. 1A-2B is that it is expected to reduce or prevent the mold compound from leaking between the substrate 20 and the first mold section 200. The bearing surface 220 of the first mold section 200 is thus less likely to be fouled by the mold compound, and the ball-pads 27 are also less likely to be covered by mold compound. As a result, the embodiment of the microelectronic device 10 with the barrier 30 shown above in FIGS. 1A-2B is expected to reduce the downtime for cleaning the mold assembly and the number of rejected parts.

Figure 3:
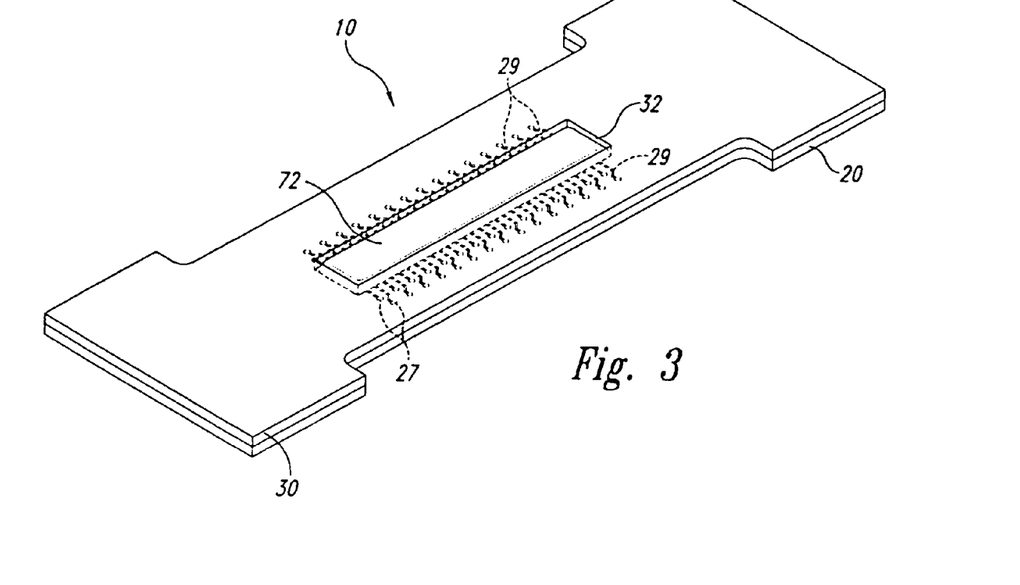
FIG. 3 is a top isometric view of a packaged microelectronic device in accordance with an embodiment of the invention.

FIG. 3 illustrates the microelectronic device 10 after a first protective casing 72 has been formed over the cap-zone A×B. The barrier 30 can remain on the substrate 20 in subsequent processing steps, such as reflow processing, marking, and other post-encapsulation processes. The barrier 30 can accordingly protect the ball-pads 27 until solder balls are deposited onto corresponding ball-pad 27. As such, another expected advantage of the microelectronic device 10 is that the barrier 30 can protect the substrate 20 from being damaged in other processes after fabricating the casings 72 and 74.

Figure 4:
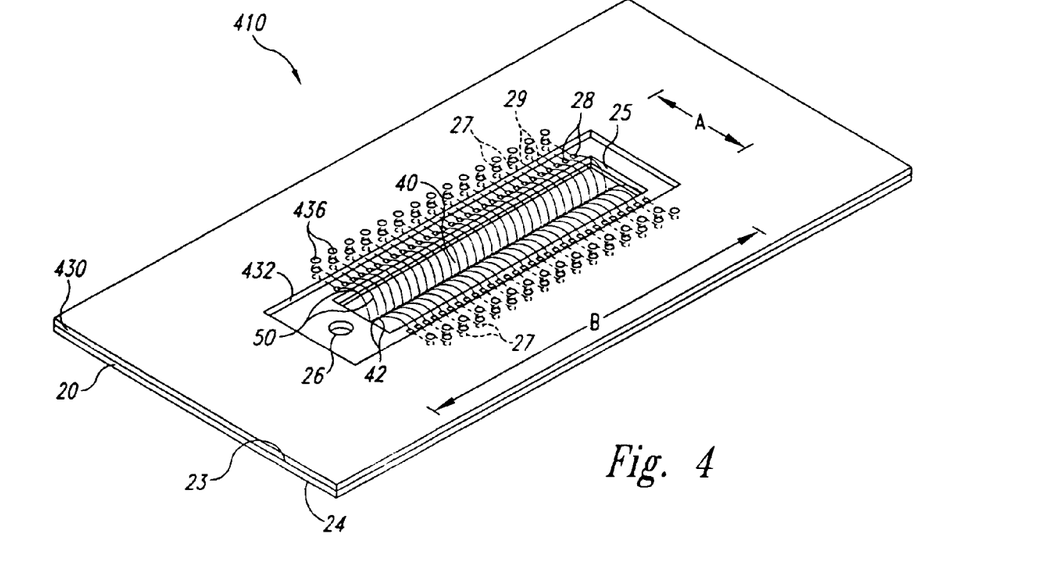
FIG. 4 is a top isometric view of a microelectronic device before being packaged in accordance with another embodiment of the invention.

FIG. 4 is a top isometric view of a microelectronic device 410 in accordance with another embodiment of the invention. In this embodiment, the microelectronic device 410 includes the substrate 20 and the die 40. The substrate 20 and the die 40 can be similar to the components described above with reference to FIGS. 1A-2B, and thus like reference numbers refer to like components in FIGS. 1A-4. The microelectronic device 410 can also include a barrier 430 having an opening 432 and a plurality of apertures 436. The opening 432 exposes the cap-zone A×B such that at least a portion of the barrier 430 is adjacent to at least a portion of the cap-zone A×B. The apertures 436 are arranged in a pattern corresponding to the pattern of ball-pads 27 on the substrate 20. Each aperture 436 exposes a corresponding ball-pad 27 such that a solder ball or a solder paste pad can be deposited onto the ball-pads 27 without removing the barrier 30. The solder balls can be deposited onto the ball-pads 27 using pen dispensers, and the solder paste pads can be deposited into the apertures 436 of the barrier 430 using screen printing techniques known in the art. In a typical application, a protective casing is formed in the opening 432 of the barrier 430 to cover the slot 25 and the contact elements 28 in a manner similar to the method set forth above with respect to FIGS. 2A and 2B. After a protective casing is formed over the cap-zone A×B of the substrate 20, the microelectronic device 410 is removed from the mold assembly and the solder balls or solder paste pads can be deposited onto the ball-pads 27.

The embodiment of the microelectronic device 410 shown in FIG. 4 is expected to prevent the mold compound from leaking between the substrate 20 and the mold assembly in a manner similar to the microelectronic device 10 described above. The microelectronic device 410 is also expected to enhance the protection of the substrate 20 in subsequent processing steps because the barrier 430 can remain on the substrate 120 throughout a reflow procedure for melting the solder balls or the solder paste pads. After the reflow procedure, the barrier 430 can be peeled or etched from the substrate 20 to remove the barrier 430 before attaching the microelectronic device 410 to a printed circuit board or other assembly. The barrier 430 also enhances the registration of the solder balls or solder paste pads with the ball-pads 27 by providing guides that prevent the solder from bridging between adjacent ball-pads 27. Therefore, the microelectronic device 410 is expected to enhance the throughput and yield of packaged microelectronic devices.

Figure 5A:
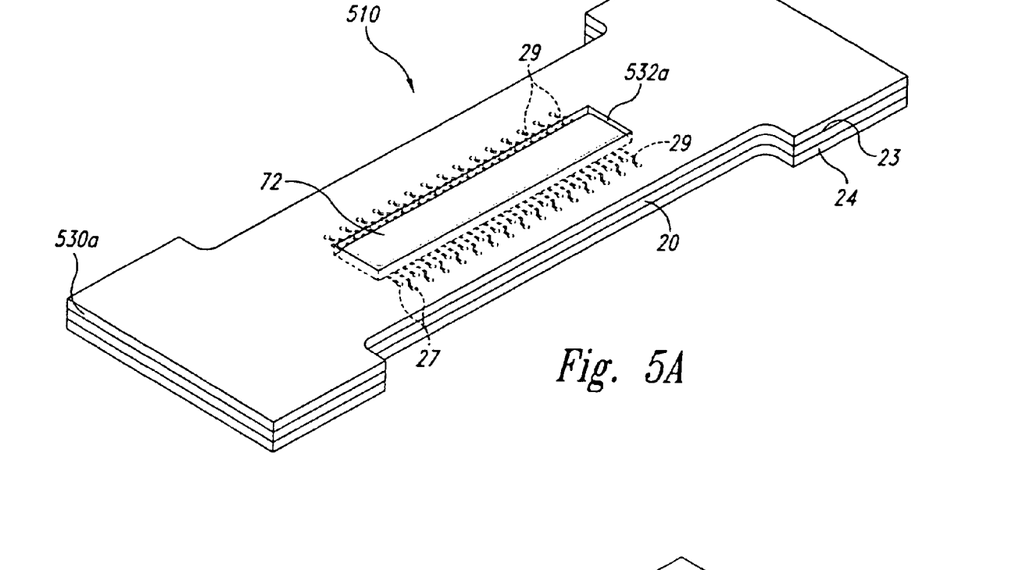
FIG. 5A is a top isometric view of a packaged microelectronic device in accordance with another embodiment of the invention.
Figure 5B:
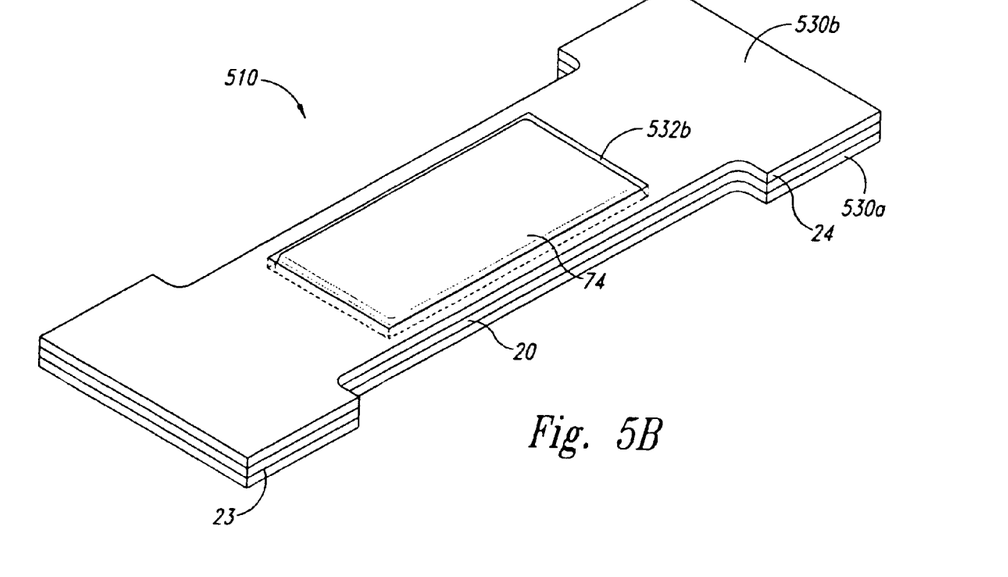
FIG. 5B is a bottom isometric view of the packaged microelectronic device of FIG. 5A.

FIG. 5A is a top isometric view and FIG. 5B is a bottom isometric view of a microelectronic device 510 in accordance with still another embodiment of the invention. In this embodiment, the microelectronic device 510 has a first barrier 530a disposed on the first surface 23 of the substrate 20 and a second barrier 530b disposed on the second surface 24 of the substrate 20. The first barrier 530a can be substantially similar to the barrier 30 described above with reference to FIG. 3. The first barrier 530a can accordingly have an opening 532a around the first protective casing 72 such that the first barrier 530a is outside of a first cap-zone on the first side 23 of the substrate 20. The second barrier 530b can be similar to the first barrier 530a, but the second barrier 530b has a second opening 532b around a second protective casing 74 that encapsulates the die 40 (FIG. 1B) on the second surface 24 of the substrate 20. The second barrier 530b is accordingly outside of a second cap-zone defined by the second protective casing 74. As such, at least a portion of the first barrier 530a is adjacent to at least a portion of the first cap-zone defined by the first protective casing 72, and at least a portion of the second barrier 530b is adjacent to at least a portion of the second cap-zone defined by the second protective casing 74.

The first and second barriers 530a and 530b shown in FIGS. 5A and 5B can define the outline of the perimeter or the entire volume of the first and/or second protective casings 72/74. Referring to FIG. 5A, the opening 532a is configured to define the perimeter of the protective casing 72. The barriers can also define the entire volume of the casings by having a thickness equal to the desired thickness of the protective casings. The thickness of a barrier can be set by laminating barriers on top of each other or manufacturing the barriers with the full thickness of the casings. One expected advantage of using the barriers to define the perimeter and thickness of the protective casings is that the casings can be formed using a flat tool (i.e. a mold without a cavity). Such flat tooling is generally not complex and it is much easier to clean compared to molds with cavities.

Figure 6:
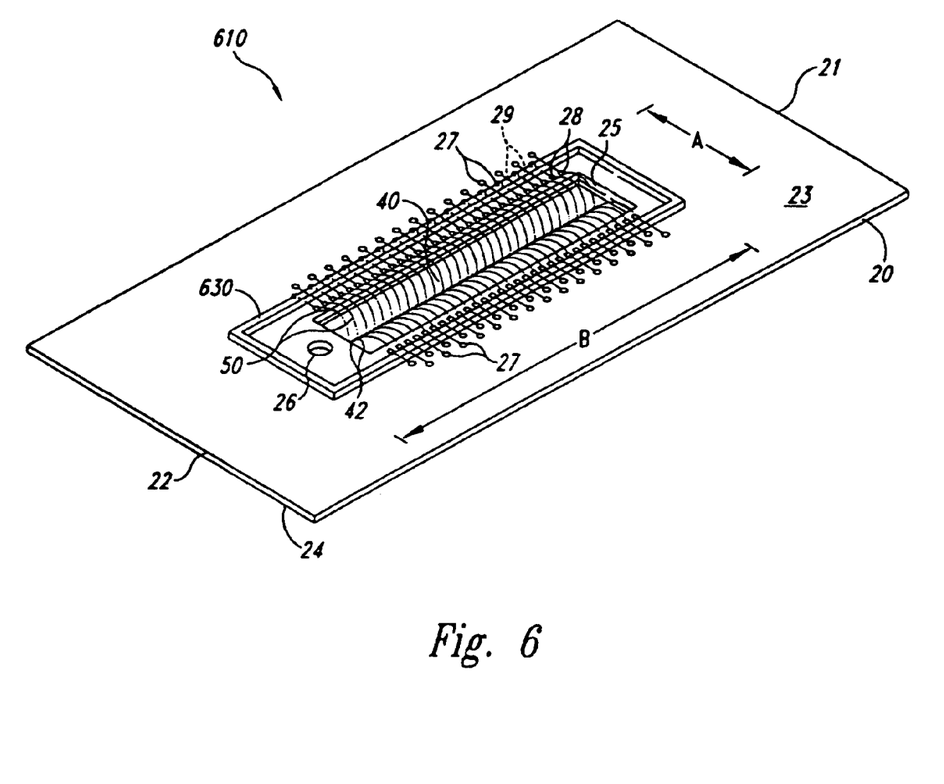
FIG. 6 is a top isometric view of a microelectronic device before being packaged in accordance with yet another embodiment of the invention.

FIG. 6 is a top isometric view of a microelectronic device 610 in accordance with another embodiment of the invention. The microelectronic device 610 includes the substrate 20 and the microelectronic die 40 attached to the substrate 20. The microelectronic device 610 can also include a barrier 630 defined by a rim around the cap-zone A×B. The barrier 630 can be a piece of tape, a pliable seal, or a raised portion of the substrate 20. For example, the barrier 630 can be a ridge molded or embossed onto the substrate 20, or the barrier 630 can be decal or a piece of tape that is attached to the first surface 23 of the substrate 20. The barrier 630 can operate in a manner similar to the barrier 130 described above with reference to FIG. 1A. The microelectronic device 610 is accordingly expected to inhibit or otherwise prevent a molding compound from leaking between the substrate 20 and a mold assembly during a molding process for forming a protective casing in the cap-zone.

From the foregoing it will be appreciated that specific embodiments of the invention have been disclosed for purposes of enablement and illustration, but that various modifications may be made without deviating from the spirit and the scope of the invention. Accordingly, the invention is not limited except by the appended claims.

The invention claimed is:

1. A method of partially encapsulating a microelectronic device, comprising:
coupling a die to a substrate, wherein the substrate comprises an encapsulation area;
disposing a seal on a first side of the substrate, wherein at least a portion of the seal is positioned adjacent to the encapsulation area;
engaging the seal with one or more mold units after disposing the seal on the first side of the substrate;
introducing a molding compound into the one or more mold units; and
removing the seal from the substrate after introducing the molding compound into the one or more mold units.

2. The method of claim 1 wherein:
the seal comprises a tape, and engaging the seal with one or more mold units comprises contacting a first surface of a first mold unit with the seal and contacting a second surface of a second mold unit with a second side of the substrate; and
introducing the molding compound into the one or more mold units comprises injecting the molding compound into at least the second mold unit.

3. The method of claim 1 wherein:
the substrate further comprises a second side attached to the die, a slot in the substrate defining a slot area that is smaller than the encapsulation area and positioned inside the encapsulation area, a contact positioned on the first side of the substrate and located inside the encapsulation area adjacent to an edge of the slot, the contact being in electrical communication with a pad positioned on the first side of the substrate outside of the encapsulation area; and
the encapsulation area further comprises a perimeter on the first side of the substrate between the contact and the pad.

4. The method of claim 3 wherein disposing the seal on the substrate further comprises covering the pad with the seal and the molding compound is introduced while the seal covers the pad.

5. The method of claim 1, further comprising:
positioning the first side of the substrate in a first cavity of a first mold unit;
positioning the die in a second cavity of a second mold unit; and
injecting the molding compound into the second cavity through a portion of the substrate and into the first cavity, wherein the molding compound forms a protective casing over the encapsulation area and the die.

6. The method of claim 1 wherein disposing the seal on the first side of the substrate comprises applying a removable seal to the first side of the substrate.

7. The method of claim 1, wherein the seal has an opening and the method further comprises inhibiting the molding material from leaking out beyond a perimeter of the opening with the seal.

8. A method of disposing a flowable material on a microelectronic device, the method comprising:
positioning a die proximate to a substrate, wherein the die and substrate are in electrical communication with each other, and wherein the substrate comprises a contact and a pad spaced apart from the contact;
attaching a barrier to the surface of the substrate, wherein the barrier comprises an opening defining a cap-zone, wherein the barrier at least partially covers the pad, and wherein the contact is positioned inside the cap-zone;
disposing the flowable material on at least a portion of the cap-zone; and
removing the barrier from the substrate after disposing the flowable material on at least a portion of the cap-zone.

9. The method of claim 8 wherein positioning the die proximate to the substrate comprises attaching the die proximate to an opening in the substrate, the opening being at least as small as the cap-zone.

10. The method of claim 8 wherein attaching the barrier to the surface of the substrate comprises forming a raised surface of the substrate.

11. The method of claim 8, further comprising:
positioning the substrate and the die in a mold unit;
contacting a first mold surface with the barrier on a first side of the substrate and contacting a second mold surface with a second side of the substrate; and
injecting the flowable material into the mold unit.

12. The method of claim 8 wherein attaching the barrier to the surface of the substrate comprises disposing a releasable barrier on the surface of the substrate.

13. The method of claim 8, further comprising inhibiting the flowable material from leaking out of the cap-zone with the barrier.

14. A method for constructing a microelectronic device, the method comprising:
electrically coupling a die to a substrate, wherein the substrate comprises a plurality of contacts and a pad on a first side of the substrate, wherein the contacts define a cap-zone, wherein the pad is spaced apart from the cap-zone, and wherein the die is positioned on a second side of the substrate proximate to a slot in the substrate;
disposing a first gasket on the first side of the substrate, wherein the gasket is positioned at least partially adjacent to the cap-zone;
positioning the die and substrate in a mold assembly after disposing the first gasket on the first side of the substrate;
injecting a molding compound into the mold assembly; and
removing the first gasket from the first side of the substrate after injecting the molding compound into the mold assembly.

15. The method of claim 14 wherein:
positioning the die and substrate in the mold assembly comprises placing the substrate in a first cavity of the mold assembly and placing the die in a second cavity of the mold assembly; and
injecting the molding compound into the mold assembly comprises (a) flowing the molding compound into the second cavity through the slot in the substrate, and (b) forming a first protective casing over the contacts of the substrate and a second protective casing over the die on the second side of the substrate.

16. The method of claim 14, further comprising inhibiting the molding compound from leaking out of the cap-zone with the first gasket.

17. The method of claim 16 wherein inhibiting the molding compound from leaking comprises engaging the first gasket with a bearing surface of the mold assembly.

18. The method of claim 14, further comprising disposing a second gasket on the second surface of the substrate, wherein the second gasket at least partially surrounds the die.

19. The method of claim 18, further comprising engaging the first gasket with a first bearing surface of the mold assembly and engaging the second gasket with a second bearing surface of the mold assembly.

20. The method of claim 14 wherein disposing the first gasket on the first side of the substrate comprises attaching a gasket having an aperture generally aligned with the pad of the substrate.

21. The method of claim 14 wherein disposing the first gasket on the first side of the substrate comprises applying a removable gasket to the first side of the substrate.

22. The method of claim 14 wherein disposing the first gasket on the first side of the substrate comprises applying at least one of a pliable thin tape, thin film, or polymeric coating to the first side of the substrate.

* * * * *